United States Patent
Mizutani et al.

(10) Patent No.: US 10,224,208 B2
(45) Date of Patent: Mar. 5, 2019

(54) PLATING METHOD AND RECORDING MEDIUM

(71) Applicant: Tokyo Electron Limited, Tokyo (JP)

(72) Inventors: Nobutaka Mizutani, Yamanashi (JP); Mitsuaki Iwashita, Yamanashi (JP); Takashi Tanaka, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 106 days.

(21) Appl. No.: 15/150,517

(22) Filed: May 10, 2016

(65) Prior Publication Data

US 2016/0336179 A1 Nov. 17, 2016

(30) Foreign Application Priority Data

May 11, 2015 (JP) .................... 2015-096756

(51) Int. Cl.
*C23C 18/16* (2006.01)
*C23C 18/18* (2006.01)
(Continued)

(52) U.S. Cl.
CPC ........ *H01L 21/288* (2013.01); *C23C 18/1637* (2013.01); *C23C 18/1651* (2013.01); *C23C 18/1844* (2013.01); *C23C 18/32* (2013.01); *C23C 18/38* (2013.01); *C23C 18/50* (2013.01); *C23C 18/54* (2013.01); *H01L 21/76843* (2013.01); *H01L 21/76874* (2013.01); *H01L 21/76898* (2013.01); *H01L 23/481* (2013.01); *H01L 23/53238* (2013.01)

(58) Field of Classification Search
CPC ............. H01L 21/288; H01L 21/76874; H01L 21/76843; H01L 21/76898; H01L 23/481; H01L 23/53238; C23C 18/34; C23C 18/1834; C25D 7/123; C25D 3/38
See application file for complete search history.

(56) References Cited

U.S. PATENT DOCUMENTS

| 4,567,066 A * | 1/1986 | Schultz | ............... C23C 18/1651 427/305 |
| 2006/0246217 A1 * | 11/2006 | Weidman | ............... B82Y 30/00 427/99.5 |

(Continued)

FOREIGN PATENT DOCUMENTS

| JP | S60-502057 A | 11/1985 |
| JP | H09-118985 A | 5/1997 |

(Continued)

*Primary Examiner* — Louis J Rufo
(74) *Attorney, Agent, or Firm* — Pearne & Gordon LLP

(57) ABSTRACT

An electroless plating process is performed on an Al layer, which is made of aluminum or an aluminum alloy, with an electroless plating liquid which is alkaline and contains a complexing agent. A plating method includes preparing a substrate 10 having a surface (for example, bottom surface of TSV 12) at which an Al layer 22 made of aluminum or an aluminum alloy is exposed; forming a zincate film 30 on a surface of the Al layer by performing a zincate treatment on the substrate; and forming a first electroless plating layer (for example, Co barrier layer 14*a*) on the surface of the Al layer with an electroless plating liquid (for example, Co-based plating liquid) which is alkaline and contains a complexing agent.

3 Claims, 3 Drawing Sheets

(51) Int. Cl.
*C23C 18/32* (2006.01)
*C23C 18/38* (2006.01)
*C23C 18/50* (2006.01)
*C23C 18/54* (2006.01)
*H01L 23/48* (2006.01)
*H01L 21/288* (2006.01)
*H01L 21/768* (2006.01)
*H01L 23/532* (2006.01)

(56) References Cited

U.S. PATENT DOCUMENTS

2009/0277679 A1* 11/2009 Jung .................. H05K 3/429
 174/266
2016/0108254 A1* 4/2016 Koyama ................ C09D 5/24
 257/753

FOREIGN PATENT DOCUMENTS

| | | | | | |
|---|---|---|---|---|---|
| JP | 2007157879 | A | * | 6/2007 | .......... H01L 23/3114 |
| JP | 4246706 | B | | 1/2009 | |
| JP | 2009194306 | A | * | 8/2009 | ....... H01L 21/67144 |
| JP | 2013-194306 | A | | 9/2013 | |
| JP | 2013194306 | A | * | 9/2013 | ......... C23C 18/1651 |
| JP | 2013-211427 | A | | 10/2013 | |
| JP | 2015110821 | A | * | 6/2015 | ............. C23C 18/36 |
| WO | 85/01070 | A1 | | 3/1985 | |

* cited by examiner

PLATING METHOD AND RECORDING MEDIUM

CROSS-REFERENCE TO RELATED APPLICATION

This application claims the benefit of Japanese Patent Application No. 2015-096756 filed on May 11, 2015, the entire disclosures of which are incorporated herein by reference.

TECHNICAL FIELD

The embodiments described herein pertain generally to a technique of forming a Co plating layer on a surface of an Al (Aluminum) layer such as an Al wiring layer in a semiconductor device.

BACKGROUND

Copper (Cu) is a wiring material widely utilized in a BEOL (Back End of Line) of a semiconductor device such as an LSI. To form a Cu wiring layer, a barrier layer for suppressing diffusion of Cu into an insulating layer needs to be formed, and a seed layer for facilitating electrolytic plating of Cu also needs to be formed on the barrier layer by electroless Cu plating. Thus, a manufacturing cost increases. For the purposes of reducing the cost, aluminum (Al) of low cost is used as the wiring material at a portion where low electric resistance as low as that of Cu is not required.

In case of forming the Cu wiring layer connected to the Al wiring layer, the barrier layer needs to be formed to suppress Cu from being diffused into an ambient insulating layer which is made of a silicon-based material.

As a way to form the barrier layer on an inner surface of a deep hole such as TSV (Through Silicon Via) before burying the Cu wiring layer within the hole, there is known a method, such as PVD (Physical Vapor Deposition), using a film forming apparatus (see, for example, Patent Document 1). As another way to form the barrier layer on the inner surface of the deep hole, there is also known an electroless plating method. One of practical materials, which can be formed by the electroless plating method and have high barrier property against Cu, is cobalt or a cobalt alloy (hereinafter, referred to as "Co-based material") (see, for example, Patent Document 2).

The present inventors have examined the application of Co-based electroless plating to the barrier layer for the Cu wiring layer connected to the Al wiring layer and has found out the following problems. A Co-based electroless plating liquid is alkaline and thus is capable of easily invading aluminum. Besides, the Co-based electroless plating liquid contains a complexing agent which is highly aggressive upon the aluminum. Thus, even if it is attempted to perform the Co-based electroless plating directly on the aluminum wiring layer, the underlying aluminum is first dissolved before the plating layer is grown. Thus, it is very difficult to form the Co-based plating layer on the aluminum wiring layer.

Patent document 1: Japanese Patent No. 4,246,706
Patent Document 2: Japanese Patent Laid-open Publication No. 2013-194306

SUMMARY

In view of the foregoing, exemplary embodiments provide a technique of performing electroless plating on an Al layer, which is made of aluminum or an aluminum alloy, with an electroless plating liquid which is alkaline and contains a complexing agent.

In one exemplary embodiment, a plating method includes preparing a substrate having a surface at which an Al layer made of aluminum or an aluminum alloy is exposed; forming a zincate film on a surface of the Al layer by performing a zincate treatment on the substrate; and forming a first electroless plating layer on the surface of the Al layer with an electroless plating liquid which is alkaline and contains a complexing agent.

In another exemplary embodiment, there is provided a computer-readable recording medium having stored thereon computer executable instructions that, in response to execution, cause a plating system to perform the plating method.

According to the exemplary embodiments, since the zincate film allows the electroless plating film to be rapidly grown, it is possible to form the electroless plating layer on the aluminum layer even if the aluminum layer is damaged by the electroless plating liquid.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
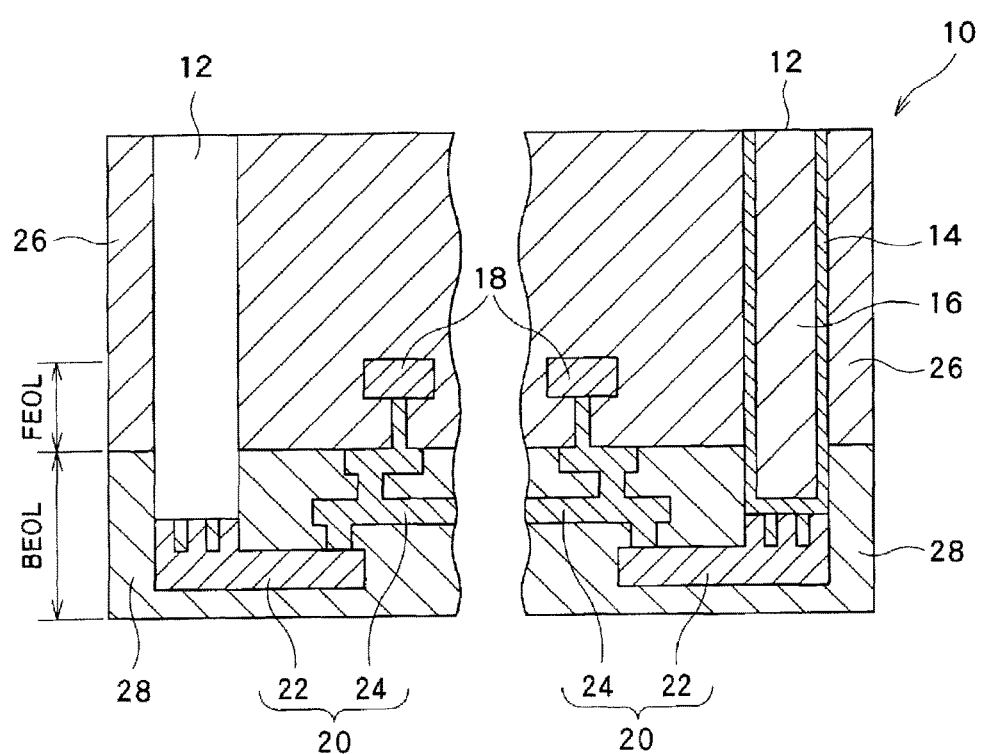
FIG. 1 is a cross sectional view schematically illustrating an example configuration of a semiconductor device on which a plating method according to an exemplary embodiment is performed.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

An exemplary embodiment to be described hereinafter is directed to a method of forming a Co barrier layer 14 made of cobalt or a cobalt alloy and a Cu wiring layer (buried wiring) 16 made of copper or a copper alloy within a TSV (Through Silicon Via) 12 which is a recess formed on a substrate 10. In this method, the Co barrier layer 14 is formed by an electroless plating method, and the Cu wiring layer 16 is formed by a plating method.

The left half of FIG. 1 illustrates a state before the Co barrier layer 14 and the Cu wiring layer 16 are formed within the TSV 12, and the right half of FIG. 1 shows a state after the Co barrier layer 14 and the Cu wiring layer 16 are formed within the TSV 12.

FIG. 1 is a simplified view of one of multiple layers of chips forming a semiconductor memory device to which a three-dimensional integration (3DI) technology is applied. This chip includes a circuit element 18, such as a transistor, formed in FEOL (Front End of Line) and a wiring layer 20 formed in BEOL (Back End of Line).

The wiring layer 20 includes an Al wiring layer 22 made of aluminum or an aluminum alloy (typically, aluminum alloy containing several percentage (%) of Cu); and a Cu wiring layer 24 made of copper or a copper alloy. Actually, other layers such as a barrier layer and a seed layer are also formed under the Cu wiring layer 24. Here, however, the other layers are not depicted in FIG. 1 for the simplicity of illustration. As explained earlier in the background, the Al wiring layer 22 can be formed at a relatively low cost. Thus, the Al wiring layer is used at a portion where Cu, which has low electric resistance but high price, need not be used for the reason that there is a sufficient wiring volume, for example.

Since a method of forming the device structure shown in the left half of FIG. 1 is well known to a person having ordinary skill in the art, description thereof will be omitted herein. The following description will only focus on a technique related to the Co barrier layer 14 and the Cu wiring layer 16 within the TSV 12.

The TSV 12 is formed through a silicon substrate (silicon wafer) 26 serving as a base of the substrate 10 and through a TEOS layer 28 formed on a bottom surface of the silicon substrate 26. Both the silicon substrate 26 and the TEOS layer 28 are made of a silicon-containing insulating material (dielectric material). Here, instead of the TEOS layer 28, a $SiO_2$ layer or a SiOC layer may be formed.

Since copper tends to easily diffuse into the silicon-containing insulating material, a barrier layer configured to suppress the diffusion of the copper needs to be formed when burying the Cu wiring layer 16 within the TSV 12. As stated in the background, there has been proposed the method of using the Co barrier layer 14, which is made of cobalt or a cobalt alloy and formed by the electroless plating method, as the barrier layer which is securely formed within the TSV 12 serving as the recess having a high aspect ratio and configured to suppress the diffusion of the copper (refer to Patent Document 2 (Japanese Patent Laid-open Publication No. 2013-194306)).

The Al wiring layer 22 is exposed at a bottom surface of the TSV 12. As explained in the background as well, it is difficult to form the Co barrier layer 14 on the Al wiring layer 22 by the electroless plating method. The present example embodiment pertains to a plating method capable of solving this problem.

Now, referring to FIG. 2A to FIG. 2F, a series of processes for forming the Co barrier layer 14 and the Cu wiring layer 16 within the TSV 12 will be elaborated. FIG. 2A to FIG. 2F provide more simplified illustrations of the structure in the vicinity of the TSV 12 than the illustration shown in FIG. 1.

Figure 2A:
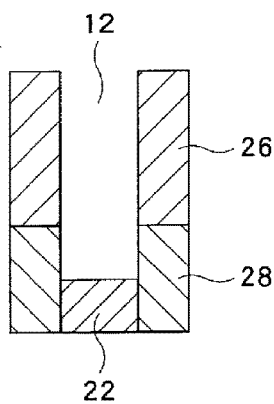
FIG. 2A to FIG. 2F are schematic cross sectional views illustrating a structure in the vicinity of a TSV to describe processes of the plating method.
Figure 2D:
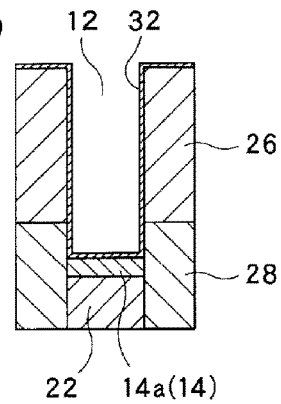
Figure 2B:
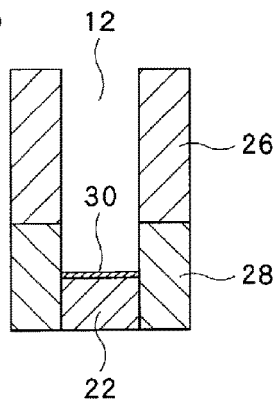
Figure 2E:
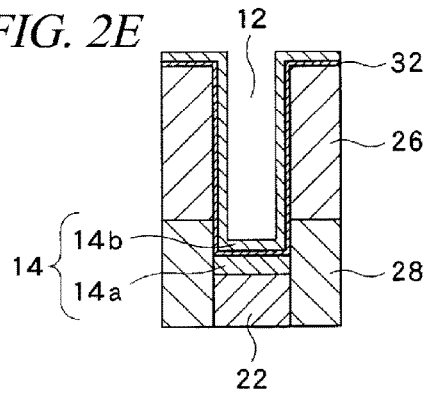
Figure 2C:
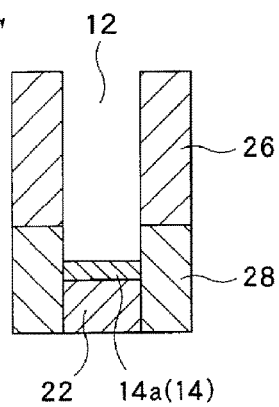
Figure 2F:
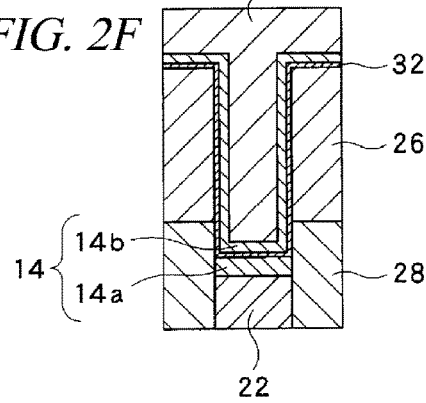

That is, FIG. 2A provides a more simplified view in the vicinity of the TSV 12 in the left half of FIG. 1.

[Oxide Film Removing Process]

First, by supplying an alkaline cleaning liquid (mainly containing NaOH) onto the substrate 10, an oxide film on a surface of the Al wiring layer 22, which is exposed within the TSV 12, is removed. Thereafter, by performing a rinse process with pure water (DIW), the alkaline cleaning liquid and a reaction byproduct are removed from the substrate 10.

[Smut Removing Process]

Subsequently, by supplying an acidic chemical liquid for smut removal onto the substrate 10, the smut ($Al(OH)_3$) generated on the surface of the Al wiring layer 22 during the oxide film removing process is removed. Then, by performing a rinse process with pure water, the acidic chemical liquid and a reaction byproduct are removed from the substrate 10.

Typically, the Al wiring layer (buried wiring layer) of the semiconductor device is made of an aluminum alloy containing several percentage (%) of Cu. Thus, since the smut does not contain impurities such as Si and Mg, the acidic chemical liquid for smut removal used herein need not contain hydrofluoric acid (which is typically contained in a general chemical liquid for smut removal). Further, it may be sufficient to use nitric acid diluted with water as the acidic chemical liquid for smut removal. This nitric acid diluted with water is advantageous in that damage on the silicon substrate 26 and the TEOS layer 28 can be reduced. The smut removing process may be performed by maintaining a state in which the surface of the substrate 10 is covered with, by way of non-limiting example, nitric acid ($HNO_3$(aq)) having a concentration of 30% at a room temperature for 30 seconds.

[Zincate Treatment Process]

Thereafter, by performing a zincate treatment on the substrate, a zinc (Zn) film (zincate film) 30 (see FIG. 2B) is formed on the surface of the Al wiring layer 22. Here, a double zincate treatment is performed.

The double zincate treatment includes: a first zincate process of precipitating Zn particles on the surface of the Al wiring layer 22 by supplying a zincate solution onto the substrate 10; a first rinse process of removing the zincate solution and a reaction byproduct from the substrate 10 with pure water; a Zn stripping process of stripping the Zn particles, which are precipitated in the first zincate process, by supplying nitric acid (which may be the same one as used in the smut removing process) onto the substrate; and a second rinse process of removing the nitric acid and a reaction byproduct from the substrate 10 with pure water; a second zincate process of precipitating Zn particles on the surface of the Al wiring layer 22 by supplying the zincate solution onto the substrate 10; and a third rinse process of removing the zincate solution and a reaction byproduct from the substrate 10 with pure water.

By performing the double zincate treatment, it is possible to precipitate finer Zn particles more densely, as compared to a case of performing a single zincate treatment (in which the zincate treatment ends in the first rinse process). In order to form a high-quality Zn film, it may be desirable to perform the double zincate treatment. However, it may be also possible to perform the single zincate treatment.

The zincate treatment is widely used to form an (electrolytic or electroless) Ni (Nickel) plating layer made of nickel or a nickel alloy on a base made of aluminum or an aluminum alloy. By the experiments conducted by the present inventors, it has been found out that a Co-based electroless plating layer can be well formed on the base made of aluminum or an aluminum alloy by performing the series of processes from the oxide film removing process to the zincate treatment under the same processing conditions (commonly known in the art) as those of the zincate treatment as a pretreatment for the Ni plating.

[First Co Barrier Layer Forming Process]

Subsequently, by supplying a Co-based electroless plating liquid onto the substrate 10, a portion 14a of the Co barrier layer 14 (see FIG. 2C) is formed on the surface of the Al wiring layer 22. Here, the Co barrier layer 14a is formed of, for example, a CoWB-based plating liquid containing tungsten (W) and boron (B).

At this time, the Zn film 30 which covers the surface of the Al wiring layer 22 is substituted with the cobalt (or cobalt alloy), so that the cobalt (or cobalt alloy) is precipitated on the surface of the Al wiring layer 22. Here, although the surface of the Al wiring layer 22 is slightly damaged by the Co-based electroless plating liquid, which is alkaline and contains the complexing agent having high aggressiveness upon the aluminum, the Co barrier layer 14a can be precipitated at a sufficiently high speed to cover the surface of the Al wiring layer 22. Accordingly, it is possible to form the Co barrier layer 14 on the surface of the Al wiring layer 22 successfully. After the Co barrier layer 14a is formed, a rinse process is performed with pure water, so that residues such as a reaction byproduct and the plating liquid are removed from the substrate 10.

In the first Co barrier layer forming process, the electroless plating is performed in the state that the zincate film (Zn particles) is formed only on the surface of the Al wiring layer 22 without being formed on the surfaces of the silicon substrate 26 and the TEOS layer 28. Thus, within the TSV 12, the Co barrier layer 14a grows only from the surface of the Al wiring layer 22. That is, Co barrier layer is not precipitated on the surfaces of the silicon substrate 26 and the TEOS layer 28.

After the first Co barrier layer forming process is completed, the surface of the Al wiring layer 22, which may be easily invaded by the Co-based electroless plating liquid, is not exposed within the TSV 12. Therefore, subsequent processes (below catalyst layer forming process and processes thereafter) can be performed in a commonly known sequence.

[Catalyst Layer Forming Process]

Subsequently, a catalyst layer 32 (see FIG. 2D) is formed within the TSV 12. By way of example, the catalyst layer can be formed by forming a SAM (Self-Assembled Monolayer) by supplying an appropriate coupling agent such as a silane coupling agent or a titanium coupling agent onto the substrate 10; supplying a catalyst ion-containing solution such as a palladium chloride solution onto the substrate 10; and supplying a reducing agent such as DMAB (dimethylamine borane) onto the substrate 10 in sequence. Through this catalyst layer forming process, the catalyst layer 32 is formed on the entire surface of the substrate 10 including the surfaces of the silicon substrate 26 and the TEOS layer 28 which are exposed within the TSV 12, i.e., an inner surface of the TSV 12. After the catalyst layer is formed, a rinse process is performed with pure water, and the supplied chemical liquid (DMAB) and a reaction byproduct are removed from the substrate 10. The method of forming the catalyst layer 32 is not limited to the aforementioned example, but various other known methods may also be employed. A catalytic metal contained in the catalyst layer 32 is not limited to palladium, and another metal such as, but not limited to, gold (Au), platinum (Pt) or ruthenium (Ru) capable of serving as the catalyst for a reduction/precipitation reaction of the electroless plating may be used instead.

[Second Co Barrier Layer Forming Process]

Then, by supplying the Co-based electroless plating liquid onto the substrate 10, another portion 14b of the Co barrier layer 14 (see FIG. 2E) is formed within the TSV 12 by an electroless plating method. That is, the Co barrier layer 14b is precipitated on the surfaces of the silicon substrate 26 and the TEOS layer 28 exposed within the TSV 12. Further, the Co barrier layer 14b is also formed on the Co barrier layer 14a already formed on the surface of the Al wiring layer 22. Still further, since the catalyst layer is formed on the entire surface of the substrate 10, the Co barrier layer 14b is formed on the entire surface of the substrate 10. After the Co barrier layer 14b is formed, a rinse process is performed with pure water (DIW), and residues such as a reaction byproduct and the plating liquid are removed from the substrate 10.

[Cu Wiring Layer Forming Process]

Thereafter, copper or a copper alloy (hereinafter, referred to as Cu) (see FIG. 2F) is precipitated to serve as a seed layer on the Co barrier layer 14 by supplying a Cu-based electroless plating liquid onto the substrate 10. Then, by burying Cu within the TSV 12 through electrolytic plating, a Cu wiring layer 16 is formed. Since the Co barrier layer 14 is formed on the entire surface of the substrate 10, the Cu wiring layer 16 is formed on the entire surface of the substrate 10. Further, depending on the size of a hole or recess (TSV 12), it may be possible to form the Cu wiring layer 16 only by the electroless plating. After the Cu wiring layer 16 is formed, a rinse process is performed with pure water, so that residues such as a reaction byproduct and the plating liquid are removed from the substrate 10.

Thereafter, unnecessary Cu plating layer on the surface of the substrate 10 (at the outside of the TSV 12) is removed by CMP (Chemical Mechanical Polishing). Then, the series of processes are ended, and the state as illustrated in the right half of FIG. 1 is obtained.

According to the above-described example embodiment, by performing the zincate treatment, the plating film made of cobalt or a cobalt alloy, which has been difficult to form on the surface of the aluminum film or the aluminum alloy film, can be formed successfully by the electroless plating method.

Accordingly, the Al wiring layer, which is exposed at the inner surface of the high-aspect-ratio recess formed in the insulating layer of the semiconductor device, can be electrically connected via the Co barrier layer 14 to the Cu wiring layer 16 which is buried in the recess.

Figure 3:
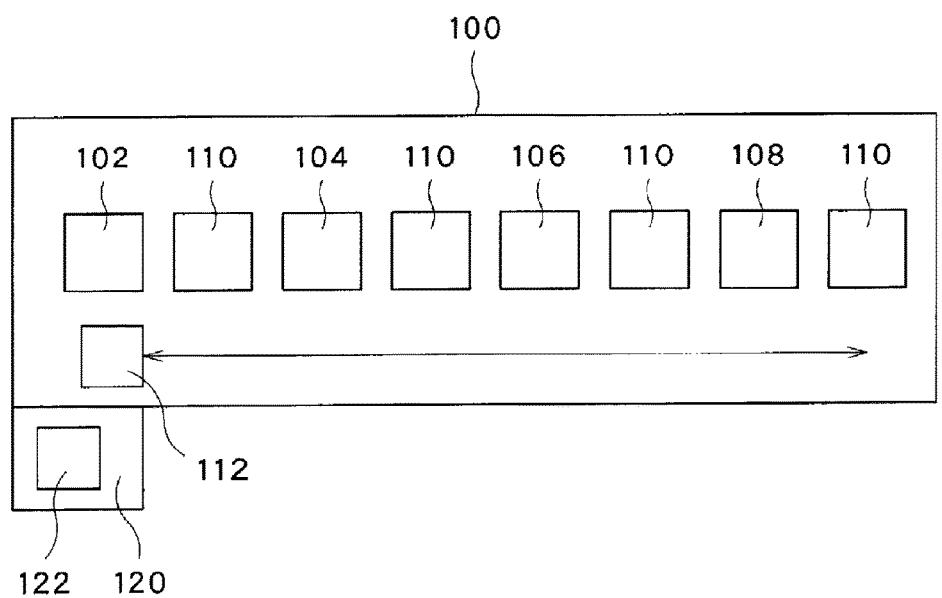
FIG. 3 is a diagram schematically illustrating a plating system configured to perform the plating method.

Now, a configuration example of a plating system configured to perform the processes from the oxide film removing process to the first Co barrier layer forming process (that is, processes performed until the Al wiring layer 22 is completely covered with the Co barrier layer 14a) will be briefly explained. As one example, the plating system may be implemented by combining batch type liquid processing baths. In this case, as schematically illustrated in FIG. 3, the plating system 100 includes an alkaline cleaning bath 102 configured to perform the oxide film removing process; an acidic cleaning bath 104 configured to perform the smut removing process and the Zn stripping process; a zincate treatment bath 106 configured to perform the first zincate process and the second zincate process; a Co electroless plating bath 108 configured to perform the first Co barrier layer forming process; and a plurality of rinse processing baths 110 configured to perform the rinse processes after the respective chemical liquid processes.

Each bath may have the same configuration as a batch type liquid processing bath which is widely utilized in the field of semiconductor device manufacture, particularly, in the fields of chemical liquid cleaning, wet etching, and the like. That is, each bath is equipped with a substrate holder (not shown), which is called a wafer boat or the like and configured to hold a multiple number of substrates 10 (semiconductor wafers) in an upright posture while maintaining a gap therebetween in a horizontal direction. An arm of a substrate transfer device 112 is configured to transfer and deliver the substrate 10 between the substrate holder of each bath while maintaining the arrangement of the wafers as is set in the wafer holder. While held by the substrate holder, the substrates 10 are sequentially dipped in a processing liquid (chemical liquid, rinse liquid, plating liquid, etc.) stored in each bath for a preset time period, so that the above-described processes are performed on the substrates 10.

An overall operation of the plating system 100 described above is controlled by a control device 120 having a computer. The control device 120 controls operations of the individual components of the plating system 100 by reading and executing various programs stored in a recording medium 122, so that the above-described respective processes are performed. The recording medium 122 stores thereon various kinds of programs such as a control program and processing recipes required to perform the above-described series of processes. The recording medium 122 may be implemented by, but not limited to, a computer-readable memory device such as a ROM or a RAM, or a disk-type recording medium such as a hard disk, a CD-ROM, a DVD-ROM or a flexible disk, as commonly known in the art.

The series of processes from the oxide film removing process to the first Co barrier layer forming process may be performed by using one or more single-wafer type liquid processing units (not shown). Each single-wafer type liquid processing unit includes a spin chuck configured to hold and rotate a substrate 10 thereon horizontally; and a nozzle configured to supply a processing liquid such as the aforementioned chemical liquid, rinse liquid or plating liquid onto the substrate 10 which is held and rotated by the spin chuck. The series of processes from the oxide film removing process to the first Co barrier layer forming process may be performed by a single liquid processing unit, or may be performed by a plurality of liquid processing units while being divided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plating method, comprising:

preparing a substrate having a surface at which an Al layer made of aluminum or an aluminum alloy is exposed;

forming a zincate film on a surface of the Al layer by performing a zincate treatment on the substrate; and forming a first electroless plating layer on the surface of the Al layer with an electroless plating liquid which is alkaline and contains a complexing agent, wherein the zincate film on the surface of the Al layer is substituted with the first electroless plating layer, the first electroless plating layer is a Co plating layer made of cobalt or a cobalt alloy, the surface of the substrate has a recess, the Al layer is an Al wiring layer having a surface exposed at a bottom surface of the recess, and in the forming of the first electroless plating layer, the first electroless plating layer is formed on the surface of the Al wiring layer which is exposed at the bottom surface of the recess, the method further comprises:

forming a catalyst layer at least on a side surface of the recess after the forming of the first electroless plating layer; and forming, as a second electroless plating layer, a Co plating layer made of cobalt or a cobalt alloy on the bottom surface and the side surface of the recess, wherein the second electroless plating layer is a barrier layer.

2. The plating method of claim 1, further comprising:

burying a Cu plating layer made of copper or a copper alloy within the recess after the forming of the second electroless plating layer.

3. A computer-readable recording medium having stored thereon computer executable instructions that, in response to execution, cause a plating system to perform a plating method as claimed in claim 1.

* * * * *